(12) United States Patent
Keser et al.

(10) Patent No.: US 10,699,980 B2
(45) Date of Patent: Jun. 30, 2020

(54) FAN OUT PACKAGE WITH INTEGRATED PERIPHERAL DEVICES AND METHODS

(71) Applicant: Intel IP Corporation, Santa Clara, CA (US)

(72) Inventors: Lizabeth Keser, Munich (DE); Bernd Waidhas, Pettendorf (DE); Thomas Ort, Veitsbronn (DE); Thomas Wagner, Regelsbach (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/938,741

(22) Filed: Mar. 28, 2018

(65) Prior Publication Data

US 2019/0304863 A1 Oct. 3, 2019

(51) Int. Cl.
| | | |
|---|---|---|
| *H01L 21/56* | (2006.01) | |
| *H01L 23/31* | (2006.01) | |
| *H01L 23/522* | (2006.01) | |
| *H01L 23/00* | (2006.01) | |
| *H01L 49/02* | (2006.01) | |

(52) U.S. Cl.
CPC ........ *H01L 23/3114* (2013.01); *H01L 21/568* (2013.01); *H01L 23/5226* (2013.01); *H01L 24/11* (2013.01); *H01L 24/14* (2013.01); *H01L 24/96* (2013.01); *H01L 28/10* (2013.01); *H01L 28/40* (2013.01); *H01L 2224/02379* (2013.01); *H01L 2924/19011* (2013.01)

(58) Field of Classification Search
CPC ............ H01L 23/3114; H01L 23/5226; H01L 21/568; H01L 24/11; H01L 24/14; H01L 24/96; H01L 28/10; H01L 28/40; H01L 2224/02379; H01L 2924/19011

See application file for complete search history.

(56) References Cited

U.S. PATENT DOCUMENTS

| | | | |
|---|---|---|---|
| 9,449,953 B1 * | 9/2016 | Shih .................... H01L 25/0655 |
| 2006/0178095 A1 * | 8/2006 | Sommer ................ B24B 37/20 451/285 |
| 2010/0059855 A1 * | 3/2010 | Lin ........................ H01L 21/565 257/528 |
| 2014/0070422 A1 * | 3/2014 | Hsiao ..................... H01L 24/24 257/774 |
| 2015/0221577 A1 * | 8/2015 | Liou ..................... H01L 23/147 257/692 |
| 2016/0071829 A1 * | 3/2016 | Yu .......................... H01L 21/56 257/773 |
| 2016/0233161 A1 * | 8/2016 | Chen ..................... H01L 25/105 |
| 2018/0061775 A1 * | 3/2018 | Velez .................... H01L 23/645 |
| 2018/0076157 A1 * | 3/2018 | Hsu ........................ H01L 21/56 |
| 2018/0102313 A1 * | 4/2018 | Shih ....................... H01L 24/16 |
| 2018/0108606 A1 * | 4/2018 | Scanlan ............ H01L 23/49838 |
| 2018/0197755 A1 * | 7/2018 | Hsu ........................ H01L 25/00 |

(Continued)

*Primary Examiner* — Sitaramarao S Yechuri
(74) *Attorney, Agent, or Firm* — Schwegman Lundberg & Woessner, P.A.

(57) ABSTRACT

A semiconductor device and method of including peripheral devices into a package is disclosed. In one example, a peripheral device includes a passive device such as a capacitor or an inductor. Examples are shown that include a peripheral device that is substantially the same thickness as a die or a die assembly. Examples are further shown that use this configuration in a fan out process to form semiconductor devices.

7 Claims, 5 Drawing Sheets

(56) References Cited

U.S. PATENT DOCUMENTS

2018/0323160 A1* 11/2018 Shih ................... H01L 24/02
2019/0051614 A1* 2/2019 Dimaano, Jr. ...... H01L 23/3128
2019/0051625 A1* 2/2019 Hsu .................... H01L 21/56

* cited by examiner

FAN OUT PACKAGE WITH INTEGRATED PERIPHERAL DEVICES AND METHODS

TECHNICAL FIELD

Embodiments described herein generally relate to integration of passive devices into semiconductor packages.

BACKGROUND

Semiconductor devices are desired with thinner profiles to be used in smaller devices, such as phones, tablets, laptops, etc. Device costs are always a concern. Methods to manufacture semiconductor devices that provide thinner profiles, reduced costs, and other advantages are desired.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1A:
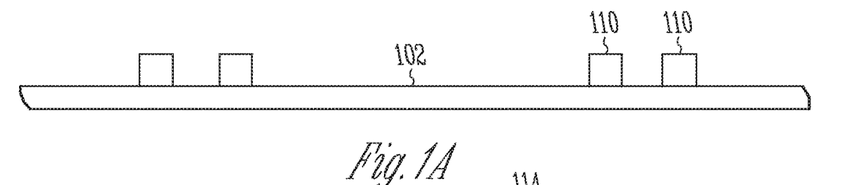
FIG. 1A-1G show diagrams of semiconductor devices in various stages of manufacture in accordance with some example embodiments.

FIG. 1A shows a diagram of a first stage of manufacture of a semiconductor device. In FIG. 1A, one or more peripheral devices 110 are coupled to a batch process carrier 102. In one example the one or more peripheral devices 110 are passive devices, including, but not limited to capacitors, inductors, etc. In one example, active devices may also be used. In one example, the batch process carrier 102 includes a fan-out wafer level carrier. Examples such as a fan-out wafer level carrier may be round. In one example, the batch process carrier 102 includes a sheet with rectangular or square geometry. Other shapes of the batch process carrier 102 are also within the scope of the invention.

FIG. 1A shows four peripheral devices 110, although the invention need only have one or more than four. Examples of peripheral devices 110 include capacitors, inductors, or other electrical devices. In one example, combinations of peripheral devices 110 may be used, such as both inductors and capacitors.

In one example, one or more peripheral devices 110 are formed from a silicon substrate. Although silicon is used as an example, other semiconductor materials may be used within the scope of the invention. In other examples, the one or more peripheral devices 110 are formed from other substrate materials apart from silicon or semiconductors. In one example, the one or more peripheral devices 110 are constructed such that they may be ground to a desired height without affecting operation of the peripheral device 110. In one example, a thick contact may be included in a top portion of the peripheral device 110, such that the ending thickness of the contact after grinding does not affect operation of the peripheral device 110. In one example a thickness of the one or more peripheral devices 110 provides a manufacturing advantage as discussed in more detail below.

Figure 1B:
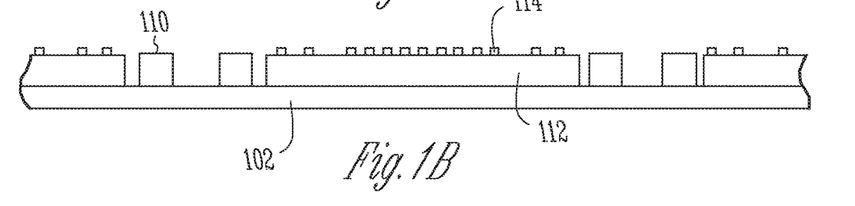

FIG. 1B shows an addition of a die 112 located adjacent to the one or more peripheral devices 110. In the example shown, the die 112 includes a plurality of die contacts 114 for connection to subsequent routing layers.

Figure 1C:
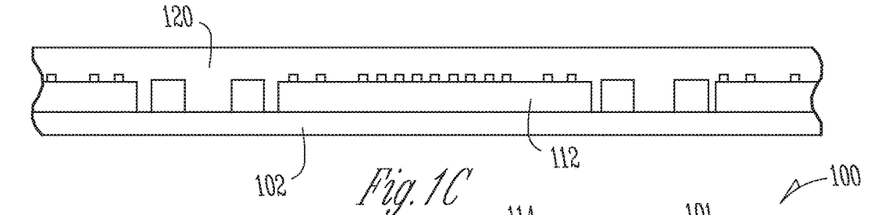

FIG. 1C shows the further addition of an encapsulant 120. The encapsulant 120 may be applied in a number of ways, including, but not limited to, flowing, pressing, injecting, spin coating, depositing, etc. An advantage of using an encapsulant 120 includes the ability to fill complex openings between components such as the die, the plurality of die contacts 114, and the one or more peripheral devices 110.

Figure 1D:
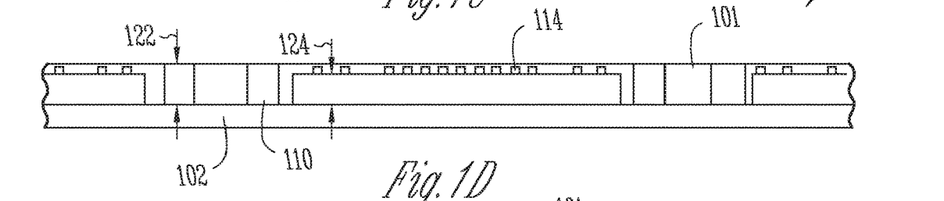

FIG. 1D shows a top surface of the assembly 100 after a planarization operation. In one example, planarization includes grinding. Other examples may include chemical mechanical polishing, or any suitable technique to remove material an produce a planar top surface 101. As referred to above, FIG. 1D illustrates a component thickness 122 of the one or more peripheral devices 110 after planarization. FIG. 1D also illustrates a die assembly thickness 124 after planarization. In the example shown, the die assembly thickness 124 includes the thickness of the die 112 plus a thickness of the plurality of die contacts 114. In other examples, the plurality of die contacts 114 may not extend beyond a surface of the die, and the die assembly thickness 124 will be equal to a thickness of the die 112 itself. In the example of FIG. 1D, after planarization, the component thickness 122 is substantially the same as the die assembly thickness 124.

In one example, an initial peripheral component 110 thickness and an initial die 112 thickness are chosen such that the are approximately the same when assembled (as shown in FIG. 1B). The initial peripheral component 110 thickness and the initial die 112 thickness are also chosen such that within a selected range, they may be ground to a more precise parallel top surface 101, and still retain functional electrical contacts. For example, a portion of the plurality of die contacts 114 may be ground away to form a planar top surface 101, and the plurality of die contacts 114 will still function as intended. Likewise, the one or more peripheral components 110 may include contacts (not shown) with an ability to be ground to a planar top surface 101 and still retain their function. As shown in FIG. 1D, after planarization, the resulting component thickness 122 and die assembly thickness 124 are substantially the same.

One advantage of using one or more peripheral components 110 and die 112 with the same thickness includes the ability to more effectively utilize batch processing techniques, such as fan-out wafer level processing, or other batch processing. If peripheral components with differing heights are used, it is difficult to integrate the peripheral components into the batch process manufacturing flow. Selected examples of subsequent processing and structures that are facilitated by the component thicknesses are discussed in more detail below.

Figure 1E:
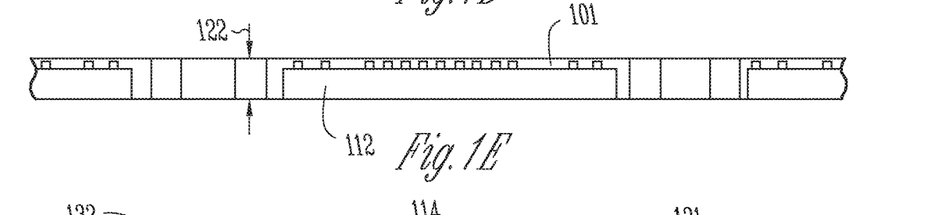

In FIG. 1E, the batch process carrier 102 has been removed from a bottom surface of the assembly 100. In FIG.

Figure 1F:
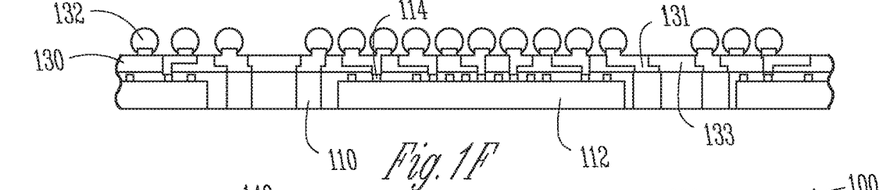

1F, an integrated routing layer 130 is shown formed over the planar top surface 101. In one example, the integrated routing layer 130 is formed from a plurality of individual layers. In one example, a conductor layer may be deposited, then etched to form electrical traces 131. Then a dielectric layer 133 may be deposited, pressed, or otherwise formed over the electrical traces 131. The integrated routing layer 130 may include one or more successive layers of electrical traces 131 and dielectric layers 133. In one example, one or more solder balls 132 may be used to connect to subsequent components, such as a mother board.

Figure 1G:
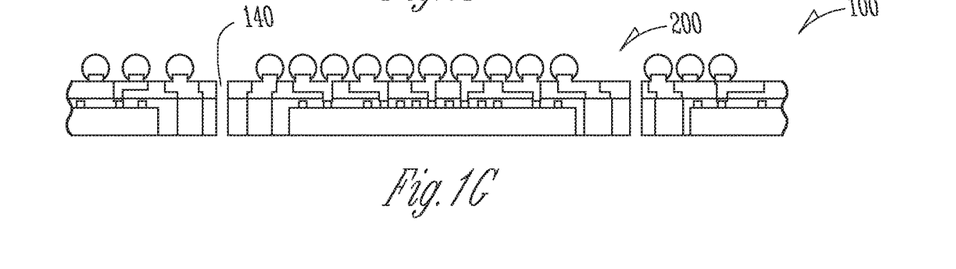

In the example shown, because of the planar top surface 101, the integrated routing layer 130 may be formed in a batch process, over the entire assembly 100, as opposed to over individual semiconductor devices. This reduces cost, and allows for finer pitch fabrication of electrical traces 131. In the example shown, the integrated routing layer 130 is wider than the die 112, and is used to couple to both the die 112, and the one or more peripheral components 110. FIG. 1G shows the assembly 100 being singulated along illustrated cut lines 140 into a number of individual semiconductor devices 200.

Figure 2:
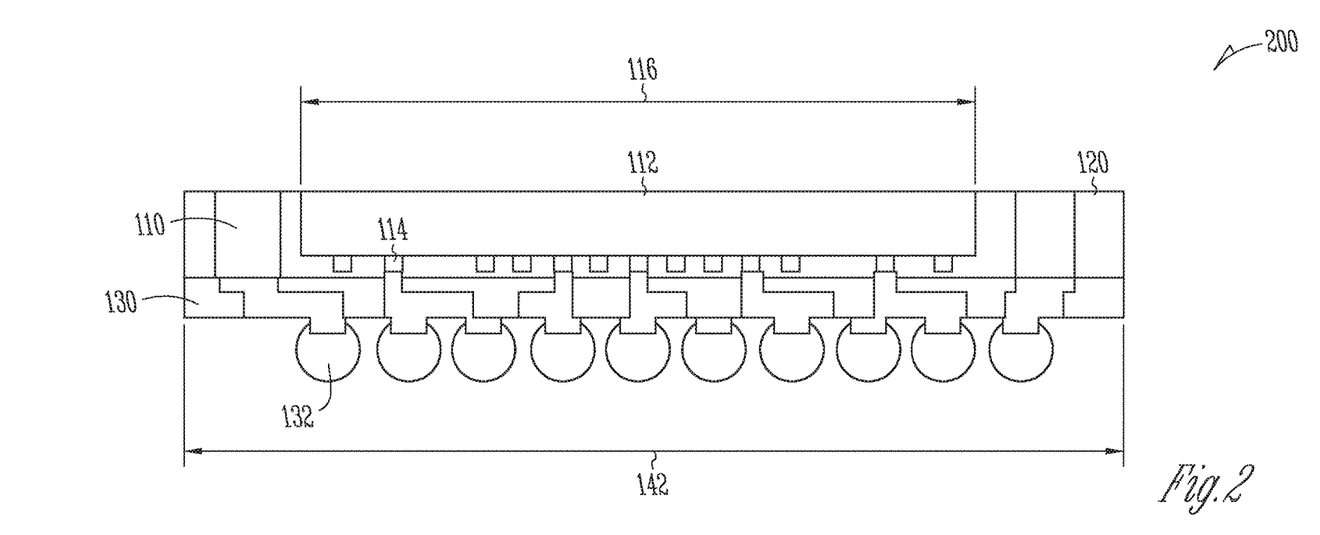
FIG. 2 shows a semiconductor device in accordance with some example embodiments.
Figure 3:
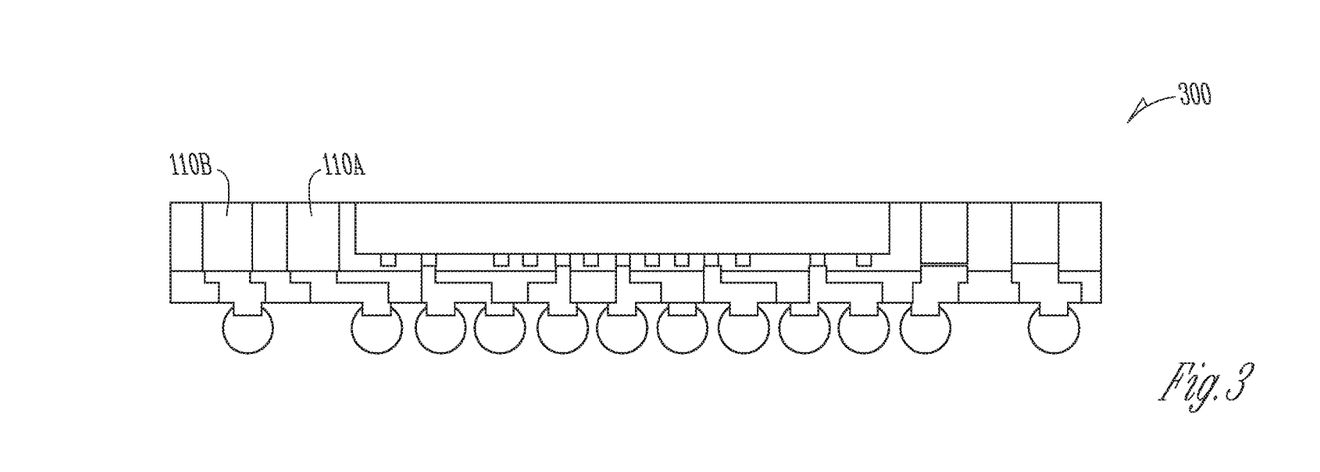
FIG. 3 shows another semiconductor device in accordance with some example embodiments.

FIG. 2 shows an individual semiconductor device 200 manufactured according to examples of the present disclosure. As noted above, the die 112 is shown having a width 116. The integrated routing layer 130 is shown having a width 142 that is wider than the die width 116. In one example, this configuration is made possible by the planar top surface 101 discussed in the preceding figures. In the example of FIG. 2, a single peripheral component 110 is located on either side of the die 112. In FIG. 3, an example semiconductor device 300 is shown with two peripheral components on either side of the die 112. In one example, the peripheral components are the same type (i.e. capacitors). In one example, the peripheral components include different types (i.e. capacitors and inductors). FIG. 3 illustrates an example that includes both a capacitor 110A and an inductor 110B.

Figure 4A:
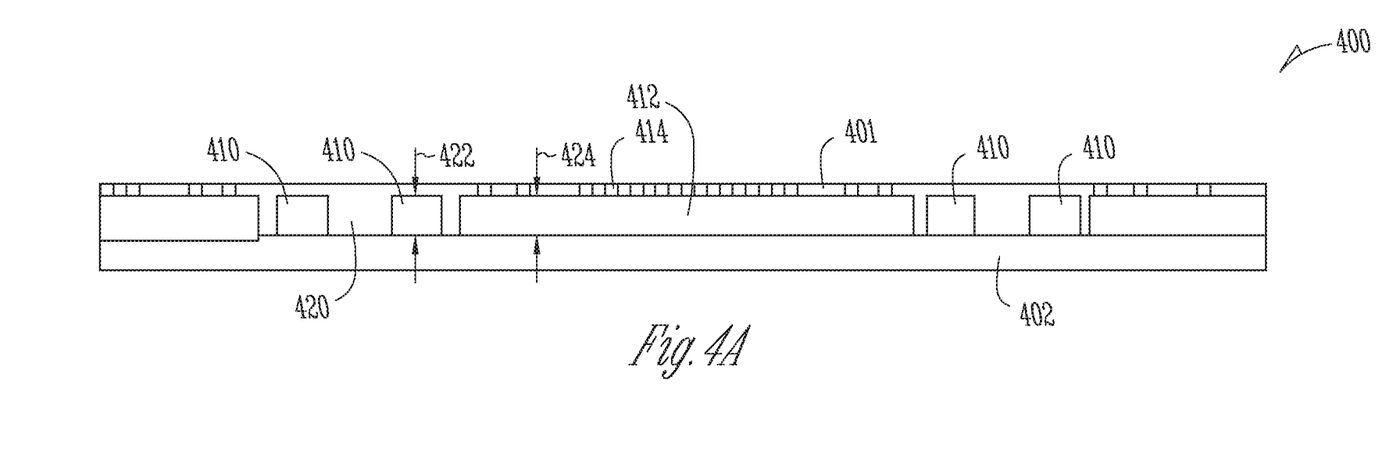
FIG. 4A-4B show diagrams of semiconductor devices in various stages of manufacture in accordance with some example embodiments.

FIG. 4A shows another example of an assembly 400. In the example of FIG. 4A, a batch process carrier 402 is shown, with a number of die 412 and one or more peripheral devices 410 coupled to the batch process carrier 402. An encapsulant 420 is shown covering the die 412 and peripheral devices 410. A plurality of die contacts 414 are shown, providing electrical access to the die 412. In the example of FIG. 4A, the one or more peripheral devices 410 have a thickness 422. The die 412 is shown having a die thickness 424. In the example shown, the peripheral device thickness 422 is substantially the same as the die thickness 424.

In the example of FIG. 4A, the top surface of the assembly 400 has been planarized by grinding, or any other suitable process, to produce a substantially planar surface 401, exposing the plurality of die contacts 414 from the encapsulant 420. In FIG. 4A, the one or more peripheral devices 410 are still covered below the substantially planar surface 401 under a thin layer of encapsulant 420.

Figure 4B:
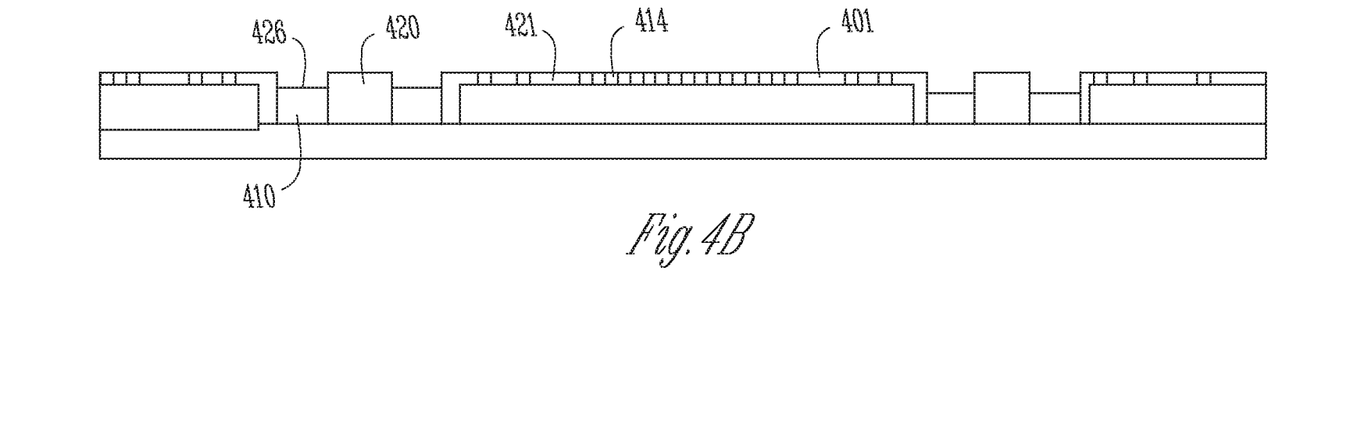

FIG. 4B shows a selective removal of the encapsulant from over the one or more peripheral devices 410, to provide electrical access through opening 426. Because the peripheral device thickness 422 is substantially the same as the die thickness 424, the amount of encapsulant to be removed is a known, consistent, amount that may be accomplished with batch processing techniques. In one example, the opening 426 is formed using a plasma etch. In one example, the opening 426 is formed using a laser etch. Although plasma and laser are used as examples, other mechanical, chemical, etc. methods may be used to form the opening 426.

After forming the substantially planar surface 401 and forming the openings 426 over the one or more peripheral devices 410, an integrated routing layer may be coupled to the one or more peripheral devices 410 and the plurality of die contacts 414. In one example the integrated routing layer is configured and formed similar to the integrated routing layer 130 as described in example above.

Figure 5:
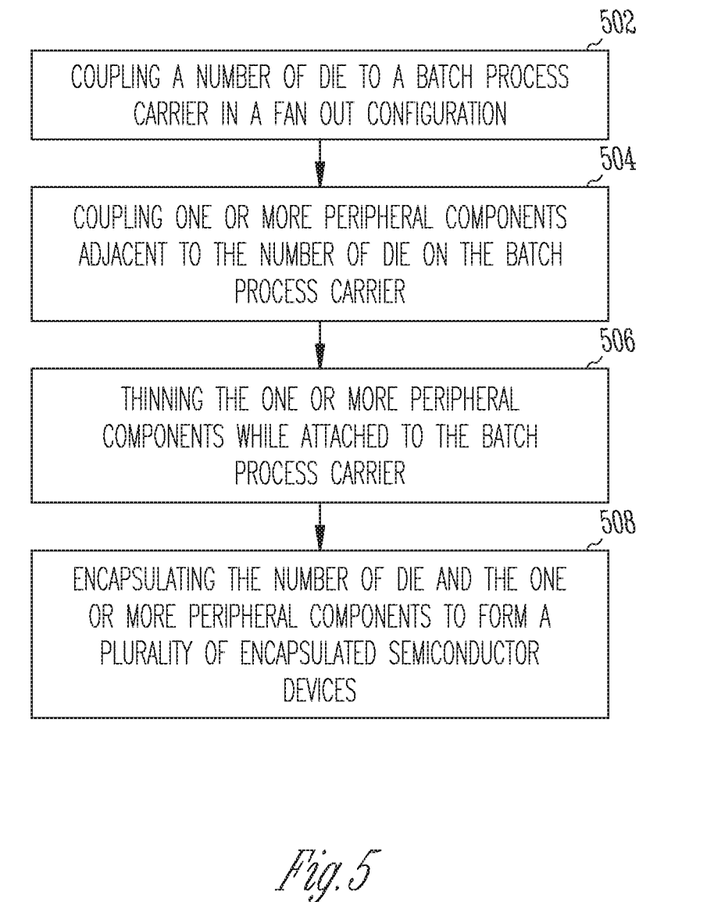
FIG. 5 shows a flow diagram of a method of manufacture of semiconductor devices in accordance with some example embodiments.

FIG. 5 shows a flow diagram of a method according to one example. In operation 502, a number of die are coupled to a batch process carrier in a fan out configuration. In operation 504, one or more peripheral components are coupled adjacent to the number of die on the batch process carrier. In operation 506, the number of die and the one or more peripheral components are encapsulated to form a plurality of encapsulated semiconductor devices. In operation 508, the one or more peripheral components are thinned while attached to the batch process carrier.

Figure 6:
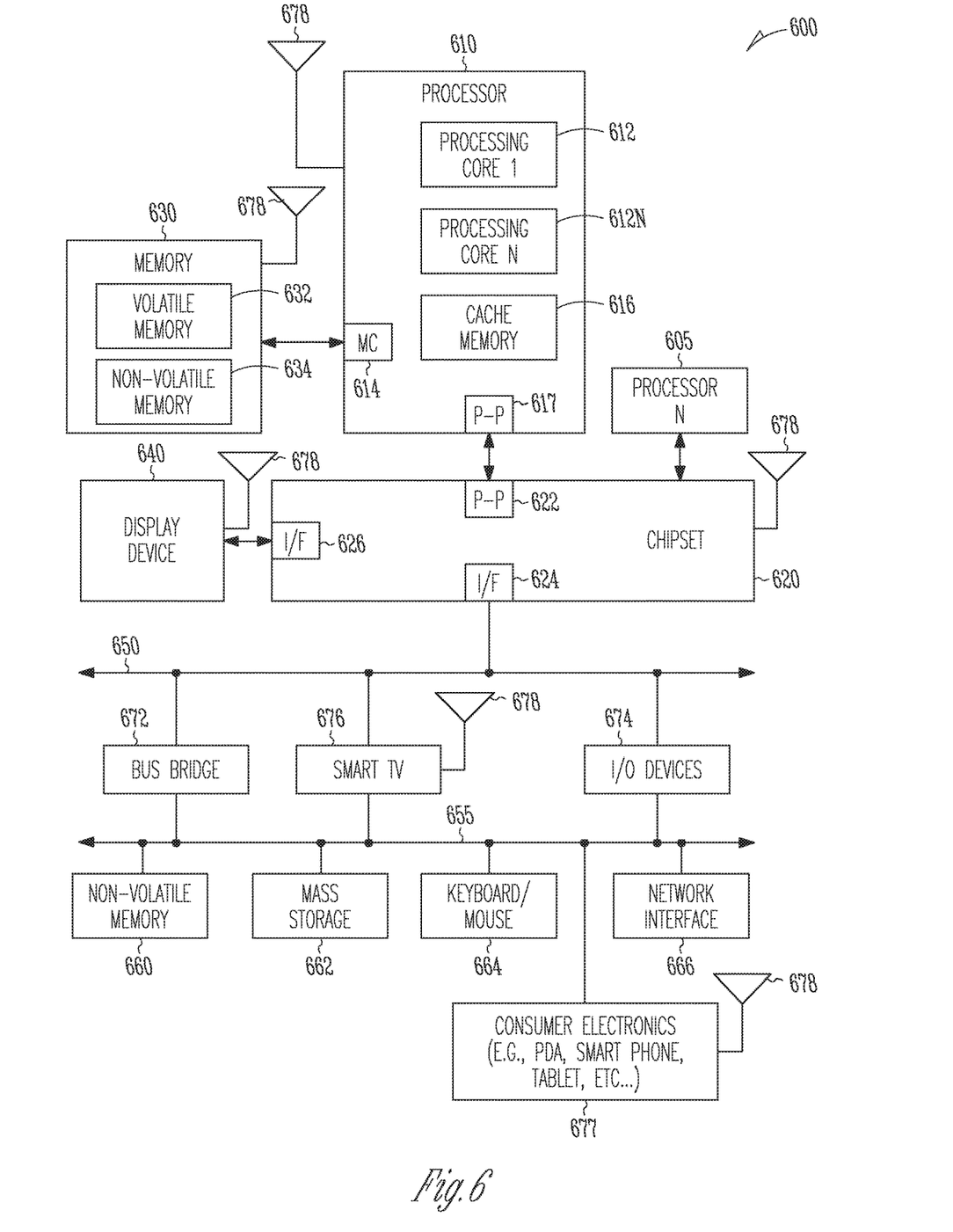
FIG. 6 shows a system that may incorporate passive devices and methods, in accordance with some example embodiments.

FIG. 6 illustrates a system level diagram, depicting an example of an electronic device (e.g., system) that may include one or more peripheral components, techniques, and/or methods described above. For example devices may include one or more peripheral components and a die or die assembly that are substantially the same thickness. FIG. 6 may also illustrate a system level diagram of an electronic device used to execute examples of the methods described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 includes a semiconductor device, the semiconductor device includes a die, including a plurality of die contacts defining a die assembly thickness between a backside of the die and ends of the plurality of die contacts. The semiconductor device includes an integrated routing layer coupled to the plurality of die contacts, wherein the integrated routing layer includes a routing layer width that is wider than the die. The semiconductor device includes an encapsulant covering one or more sides of the die, the encapsulant extending laterally to the same width as the integrated routing layer, and at least one encapsulated peripheral component located laterally adjacent to the die, and coupled to the integrated routing layer, wherein the at least one encapsulated peripheral component is substantially the same thickness as the die assembly thickness.

Example 2 includes the semiconductor device of example 1, wherein the at least one encapsulated peripheral component includes a capacitor.

Example 3 includes the semiconductor device of any one of examples 1 and 2, wherein the at least one encapsulated peripheral component includes an inductor.

Example 4 includes the semiconductor device of any one of examples 1-3, wherein the at least one encapsulated peripheral component is formed within a silicon substrate.

Example 5 includes the semiconductor device of any one of examples 1-4, wherein the plurality of die contacts include a plurality of copper bumps.

Example 6 includes the semiconductor device of any one of examples 1-5, wherein the at least one encapsulated peripheral component includes multiple peripheral components of different passive component types.

Example 7 includes a semiconductor device including a die, including a plurality of die contacts, an integrated routing layer coupled to the plurality of die contacts, wherein the integrated routing layer includes a routing layer width that is wider than the die, an encapsulant covering one or more sides of the die, the encapsulant extending laterally to the same width as the integrated routing layer, and at least one encapsulated peripheral component located laterally adjacent to the die, and coupled to the integrated routing layer, wherein the at least one encapsulate peripheral component is substantially the same thickness as the die.

Example 8 includes the semiconductor device of example 7, wherein the at least one encapsulated peripheral component includes a capacitor.

Example 9 includes the semiconductor device of any one of examples 7 and 8, wherein the at least one encapsulated peripheral component includes an inductor.

Example 10 includes the semiconductor device of any one of examples 7-9, wherein the at least one encapsulated peripheral component is formed within a silicon substrate.

Example 11 includes the semiconductor device of any one of examples 7-10, wherein the plurality of die contacts include a plurality of copper bumps.

Example 12 includes the semiconductor device of any one of examples 7-11, wherein the at least one encapsulated peripheral component includes multiple peripheral components of different passive component types.

Example 13 includes the semiconductor device of any one of examples 7-12, wherein the encapsulant includes a planar surface that is coplanar with the plurality of die contacts.

Example 14 includes a method, including coupling a number of die to a batch process carrier in a fan out configuration, coupling one or more peripheral components adjacent to the number of die on the batch process carrier, encapsulating the number of die and the one or more peripheral components to form a plurality of encapsulated semiconductor devices, and thinning the one or more peripheral components while attached to the batch process carrier.

Example 15 includes the method of example 14, wherein thinning the one or more peripheral components includes thinning before the encapsulating step, wherein a resulting thickness of the one or more peripheral components is the same as a thickness of the number of die.

Example 16 includes the method of any one of examples 14-15, further including removing material over each of the one or more peripheral components to expose one or more peripheral component contacts.

Example 17 includes the method of any one of examples 4-16, wherein removing material includes plasma removal.

Example 18 includes the method of any one of examples 14-17, wherein removing material includes laser removal.

Example 19 includes the method of any one of examples 14-18, wherein thinning the one or more peripheral components includes thinning after the encapsulating step, wherein a resulting thickness of the one or more peripheral components is the same as a thickness of the number of die plus a die contact thickness.

Example 20 includes the method of any one of examples 14-19, wherein thinning the one or more peripheral components includes grinding.

Example 21 includes the method of any one of examples 14-20, further including forming number of integrated routing layers over the number of die and the one or more peripheral components, wherein each integrated routing layer is wider than each die.

Example 22 includes the method of any one of examples 14-21, wherein coupling the number of die to the batch process carrier includes coupling the number of die to a circular wafer carrier.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:
1. A method, comprising:
coupling a number of die to a batch process carrier in a fan out configuration;
coupling one or more peripheral components adjacent to the number of die on the batch process carrier;
encapsulating the number of die and the one or more peripheral components to form a plurality of encapsulated semiconductor devices; and
thinning the one or more peripheral components while attached to the batch process carrier, wherein thinning the one or more peripheral components includes thinning before the encapsulating step, wherein a resulting thickness of the one or more peripheral components is the same as a thickness of the number of die.

2. The method of claim 1, further including removing material over each of the one or more peripheral components to expose one or more peripheral component contacts.

3. The method of claim 2, wherein removing material includes plasma removal.

4. The method of claim 2, wherein removing material includes laser removal.

5. The method of claim 1, wherein thinning the one or more peripheral components includes grinding.

6. The method of claim 1, further including forming a number of integrated routing layers over the number of die and the one or more peripheral components, wherein each integrated routing layer is wider than each die.

7. The method of claim 1, wherein coupling the number of die to the batch process carrier includes coupling the number of die to a circular wafer carrier.

* * * * *